(12) United States Patent
Ravatin et al.

(10) Patent No.: US 7,057,452 B2
(45) Date of Patent: Jun. 6, 2006

(54) METHOD AND CIRCUIT FOR CORRECTING THE OFFSET OF AN AMPLIFICATION CHAIN

(75) Inventors: Jean Ravatin, Moirans (FR); François Van Zanten, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/765,767

(22) Filed: Jan. 26, 2004

(65) Prior Publication Data

US 2004/0155703 A1   Aug. 12, 2004

(30) Foreign Application Priority Data

Jan. 28, 2003   (FR)   ................................. 03 00933

(51) Int. Cl.
*H03F 1/02*   (2006.01)
(52) U.S. Cl. ...................... 330/9; 327/552; 327/553; 327/554; 333/17.1; 333/172; 333/173; 333/174
(58) Field of Classification Search ........ 327/552–554; 330/9; 331/17.1, 172, 173–174
See application file for complete search history.

(56) References Cited

U.S. PATENT DOCUMENTS

| 5,708,376 A | 1/1998 | Ikeda ........................... 327/50 |
| 5,914,633 A * | 6/1999 | Comino et al. ............. 327/553 |
| 6,351,506 B1 | 2/2002 | Lewicki ...................... 375/350 |
| 6,404,578 B1 | 6/2002 | Bhandari et al. ............. 360/61 |
| 6,429,733 B1 * | 8/2002 | Pagliolo et al. ............. 327/552 |
| 6,628,163 B1 * | 9/2003 | Dathe et al. ................. 327/553 |
| 6,677,814 B1 * | 1/2004 | Low et al. ................... 327/554 |
| 6,686,809 B1 * | 2/2004 | Nystrom et al. ........... 333/17.1 |
| 2002/0190810 A1 * | 12/2002 | Nystrom et al. ........... 333/17.1 |

\* cited by examiner

*Primary Examiner*—Rexford Barnie
*Assistant Examiner*—Khai Nguyen
(74) *Attorney, Agent, or Firm*—Lisa K. Jorgenson; Dennis M. de Guzman; Seed IP Law Group PLLC

(57) ABSTRACT

A circuit for correcting the offset of an amplification and filtering chain having a predetermined gain and cut-off frequency depending on the value of at least one capacitor, comprising: a correction means for subtracting from the chain input a correction signal depending on the value of a programmable digital word; a digital automaton for, in a setting phase, searching, then memorizing one of two consecutive values of the digital word between which the output signal of the chain switches sign, the input signal being canceled during a setting phase; and comprising a means for, during the setting phase, reducing the value of said at least one capacitor with respect to its normal operating value.

21 Claims, 2 Drawing Sheets

METHOD AND CIRCUIT FOR CORRECTING THE OFFSET OF AN AMPLIFICATION CHAIN

BACKGROUND OF THE INVENTION

1. Field of the Invention

The present invention relates to the correction of the offset of an amplification chain, and in particular of the offset of an amplification and low-pass filtering chain.

2. Description of the Related Art

An amplification and filtering chain is for example used at the output of an antenna block of a mobile phone to amplify and filter a noisy signal received with a low amplitude. Amplifiers used in such a chain frequently exhibit an offset to which the signals received by the amplifiers add. This offset reduces the maximum value of the signals that can be received by the amplifiers without for the amplifiers to be saturated, which reduces the chain performances. The offset of an amplification chain is generally corrected by subtracting from the signal received at the chain input a correction signal substantially equal to the chain offset.

FIG. 1 very schematically shows an amplification and filtering chain 2 provided with an offset correction circuit 4. Chain 2 and correction circuit 4 are integrated on a same chip. Chain 2 comprises an input terminal I receiving a signal from an antenna block not shown and an output terminal O. Terminal I is connected to the input of an amplifier 6. The output of amplifier 6 is filtered by a low-pass filter 8 having a cut-off frequency Fc8 before being provided to an amplifier 10. The output of amplifier 10 is filtered by a low-pass filter 12 having a cut-off frequency Fc12 before being provided to output terminal O. Correction circuit 4 comprises a digital automaton 14 having an input terminal connected to output terminal O of the chain. Automaton 14 provides over a bus 16 a control word COM to a digital-to-analog converter (DAC) 18. The output of converter 18 is connected to input terminal I of chain 2. Correction circuit 4 further comprises a switch 20 enabling cancellation of the signal provided by the antenna block to input terminal I. Automaton 14 and switch 20 are controlled by a means not shown.

It is considered hereafter that terminal I receives from the antenna block an input signal SI and signals at higher frequency, and that terminal O provides as a response an output signal SO. If the signals at higher frequency are totally suppressed by the filters of chain 2; if G is the gain of chain 2 and $\Delta$ is the offset of chain 2; and if $\delta$ is a correction signal, positive or negative, permanently provided on input terminal I by converter 18 as a response to word COM, one has, in normal operation of the chain: $SO = G \cdot (\Delta + \delta + SI)$.

The value of correction signal $\delta$ is determined in a setting phase to minimize sum $\Delta + \delta$. In the setting phase, switch 20 is off. Output O then provides an output signal $SO = G(\Delta + \delta)$. At the beginning of the setting phase, automaton 14 provides a control word COM such that converter 18 generates a zero correction signal 6, after which it measures the sign of signal SO. Automaton 14 then modifies the value of word COM to any one of two consecutive values between which signal $SO = G(\Delta + \delta)$ switches sign. This value of word COM, for which sum $\Delta + \delta$ is minimum, is then memorized and permanently provided to converter 18. The setting phase is over, switch 20 is on, and the chain can operate normally. According to an alternative, the automaton may at the beginning of the setting phase provide a control word COM for which it is provided that sum $\Delta + \delta$ is zero, then adjust the value of signal $\delta$.

The above correction circuit operates satisfactorily but it requires a setting phase which may be too long. Indeed, in certain systems such as mobile phones, signal SI is received in the form of packets separated by idle periods. To limit the system consumption, amplification chain 2 is only activated to receive each packet and powered off for idle periods. Now, the offset of amplification chain 2 may vary from one activation of the chain to the other, for example, due to a change in temperature or in supply voltage. Thus, the setting phase of the offset correction circuit may be implemented after each activation of chain 2. The longer the setting phase, the longer chain 2 must be powered on before the packet reception, which increases the system consumption.

It has been seen that the setting of correction circuit 4 comprises a modification of the bits of word COM by digital automaton 14. Each time digital automaton 14 modifies a bit of word COM, and thereby signal $\delta$ provided at the chain input, it must wait for a predetermined duration t to be sure that the chain has effectively transmitted the modification to its output SO before measuring the sign of signal SO. In practice, if the chain exhibits a cut-off frequency Fc (the smallest of cut-off frequencies Fc8 and Fc12 of filters 8 and 12), predetermined duration t depends on 1/Fc. If word COM comprises n bits, the setting phase lasts for n times duration t. To reduce the duration of the setting phase, the number of bits of word COM thus has to be reduced, which reduces the accuracy of offset $\Delta$.

A solution to this problem consists of not using the above correction circuit 4, and of using an analog correction circuit which requires no setting phase and subtracts from signal SI the D.C. portion of a feedback signal equal to the division of output signal SO by gain G of the chain. However, such a correction circuit is expensive since it imposes using a large capacitor to extract the D.C. portion of the feedback signal.

BRIEF SUMMARY OF THE INVENTION

An embodiment of the present invention provides an inexpensive and easy-to-set offset correction circuit.

Another embodiment of the present invention provides an inexpensive and fast-to-implement offset correction method.

Generally, an embodiment of the present invention comprises shortening the duration of the setting phase by increasing the cut-off frequency of the chain. For this purpose, the embodiment provides, in the setting phase, increasing the cut-off frequency of each low-pass filter of the chain by reducing the value of the capacitors used in each filter.

More specifically, one embodiment of the present invention provides a circuit for correcting an offset of an amplification and low-pass filtering chain having a predetermined gain and a predetermined cut-off frequency depending on a value of at least one capacitor, comprising a correction means for subtracting from an input signal of the chain a correction signal depending on the value of a programmable digital word, a digital automaton for, in a setting phase, searching, then memorizing one of two consecutive values of the digital word between which an output signal of the chain switches sign, the input signal being canceled during the setting phase, and comprising a means for, during the setting phase, reducing the value of said at least one capacitor with respect to its normal operating value.

According to an embodiment of the present invention, the chain has a predetermined cut-off frequency depending on the value of several capacitors, and the circuit for correction the chain offset comprises a means for, during the setting phase, reducing the value of each capacitor with respect to its normal operating value.

According to an embodiment of the present invention, the means for reducing the value of said at least one capacitor consists in a means for switching said at least one capacitor with a capacitor of value smaller than the normal operating value of said at least one capacitor.

According to an embodiment of the present invention, said at least one capacitor is formed of a capacitor of small value connected in parallel to a plurality of small capacitors, each series-connected to a respective programmable switch, and the means for reducing the value of said at least one capacitor is capable of controlling the turning-off of the programmable switches.

One embodiment of the present invention also aims at a method for correcting the offset of a chain of amplification and low-pass filtering of an input signal, having a predetermined gain and a predetermined cut-off frequency depending on the value of at least one capacitor, comprising:

a) canceling the input signal of the chain;

b) subtracting from the input signal of the chain a correction signal depending on a value of a digital word and modifying said value from a predetermined initial value to any one of two consecutive values between which an output signal of the chain switches sign; and c) memorizing the value of the digital word;

the value of said at least one capacitor being during the implementation of b) reduced with respect to its normal operating value to increase the cut-off frequency.

The foregoing features of the present invention will be discussed in detail in the following non-limiting description of specific embodiments in connection with the accompanying drawings.

DETAILED DESCRIPTION

Embodiments of a method and circuit for correcting the offset of an amplification chain are described herein. In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
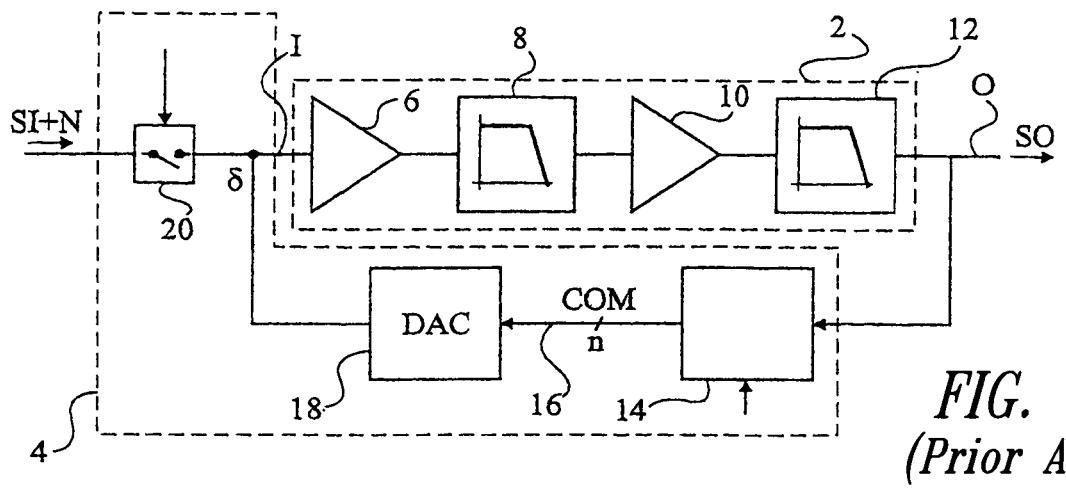
FIG. 1, previously described, schematically shows an amplification and filtering chain provided with a conventional offset-correction circuit.

Same elements have been designated with same reference numerals in FIG. 1 and in the next drawings. Only those elements necessary to the understanding of embodiments of the present invention have been shown.

Figure 2:
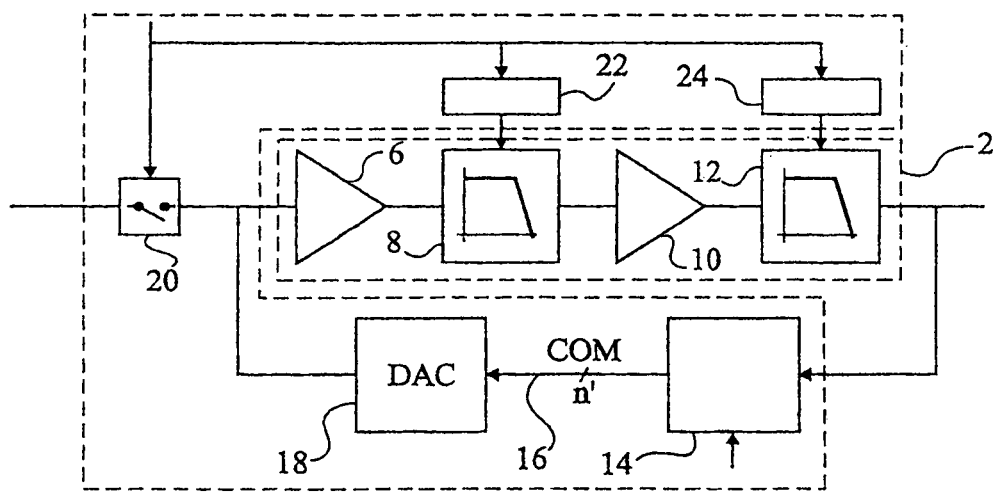
FIG. 2 schematically shows an amplification and filtering chain provided with an offset-correction circuit according to one embodiment of the present invention.

FIG. 2 schematically shows an amplification and filtering chain 2 provided with an offset-correction circuit according to one embodiment of the present invention. Chain 2 has the same structure as in FIG. 1. In addition to automaton 14, to digital-to-analog converter 18, and to switch 20, the circuit according to this embodiment of the present invention comprises setting elements 22 and 24, described hereafter that, when activated, increase the cut-off frequencies of filters 8 and 12.

Setting elements 22 and 24 are activated in the setting phase. The cut-off frequency of chain 2 then increases from Fc to Fc'. In the setting phase, the waiting time between each modification of a bit of word COM and the measurement of the sign of signal SO corresponding to this modification decreases from t to t'. t' being smaller than t, more tests can be carried out within a given time and thus a word COM comprising a large number of bits can be used, and the accuracy of the chain offset correction can be increased.

As an example, if cut-off frequency Fc of the chain is 100 kHz and if cut-off frequency Fc' modified according to one embodiment of the present invention is 300 kHz, number n' of bits of the word COM of an embodiment of a correction circuit can be 3 times greater than the number of bits n of the same word in a conventional correction circuit. If duration T available for the setting phase is 14 μs and if t=0.35/Fc=3.5 μs and t'=0.35/Fc'=1.16 μs, n is equal to 4 and n' to 12. If Δ can vary between −0.5 and +0.5 volt, correction signal δ has an accuracy of 62.5 millivolts if it is generated by digital-to-analog converter 18 as a response to a word COM of n=4 bits, and an accuracy of 244 microvolts if it is generated according to one embodiment of the present invention as a response to a word COM of n'=12 bits.

Figure 3:
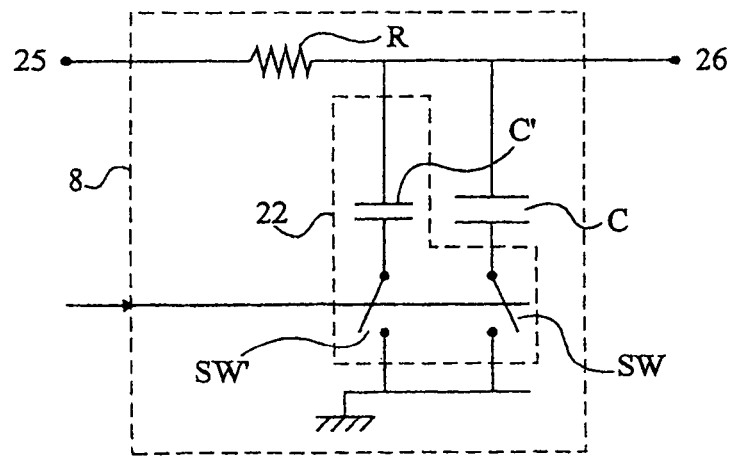
FIG. 3 schematically shows a first example of a filter provided with a setting element according to one embodiment of the present invention to increase its cut-off frequency.

FIG. 3 shows an embodiment of filter 8 of FIG. 2 and of setting element 22 according to the present invention coupled to the filter 8 to increase the cut-off frequency of filter 8. Filter 12 and setting element 24 according to one embodiment of the present invention may respectively have the same structure as filter 8 and element 22. Filter 8 comprises an input terminal 25 and an output terminal 26 connected by a resistor R. A capacitor C has a first terminal connected to the output terminal of filter 8 and a second terminal connected to a common-mode voltage, here, the ground. Setting element 22 comprises a capacitor C' of smaller value than capacitor C, having a terminal connected to the output of filter 8 and having another terminal connected to ground via a switch SW'. Element 22 further comprises a switch SW interposed between the second terminal of capacitor C and the ground.

In normal operation, switches SW and SW' are respectively on and off and the cut-off frequency of filter 8 is $Fc=1/2\pi RC$. In the setting phase, element 22 is controlled for switches SW and SW' to be respectively off and on. The cut-off frequency of filter 8 then is $Fc'=1/2\pi RC'>Fc$. The choice of the value of capacitor C' enables determining cut-off frequency Fc'. Setting element 22 is particularly simple and inexpensive to implement, which is an additional advantage of one embodiment of the present invention.

One embodiment of the present invention has been described in relation with an amplification chain referenced to a common-mode voltage and having a single input terminal I and a single output terminal O, but those skilled in the art will easily adapt the embodiment to a differential amplification chain having two differential input terminals and two differential output terminals. Such a chain will use differential filters. Such a differential filter may for example be formed of two filters 8 such as in FIG. 3 having their common modes interconnected. Those skilled in the art should note that an imbalance between resistors R of the two filters 8 forming a differential filters also introduces an offset in the chain using this filter. Those skilled in the art should also note that the increase in the cut-off frequency of the filter according to one embodiment of the present invention by reduction of the value of the filter capacitors does not modify the offset introduced by the filter in the chain. This enables accurate setting of the offset-correction signal of the chain and is an additional advantage of the embodiment.

An embodiment of the present invention has been described in relation with an amplification and filtering chain using filters having a voltage input and a voltage output, but the present invention also applies to a chain using other types of filters, for example, filters having a current input and a voltage output such as a Ranch filter.

Figure 4:
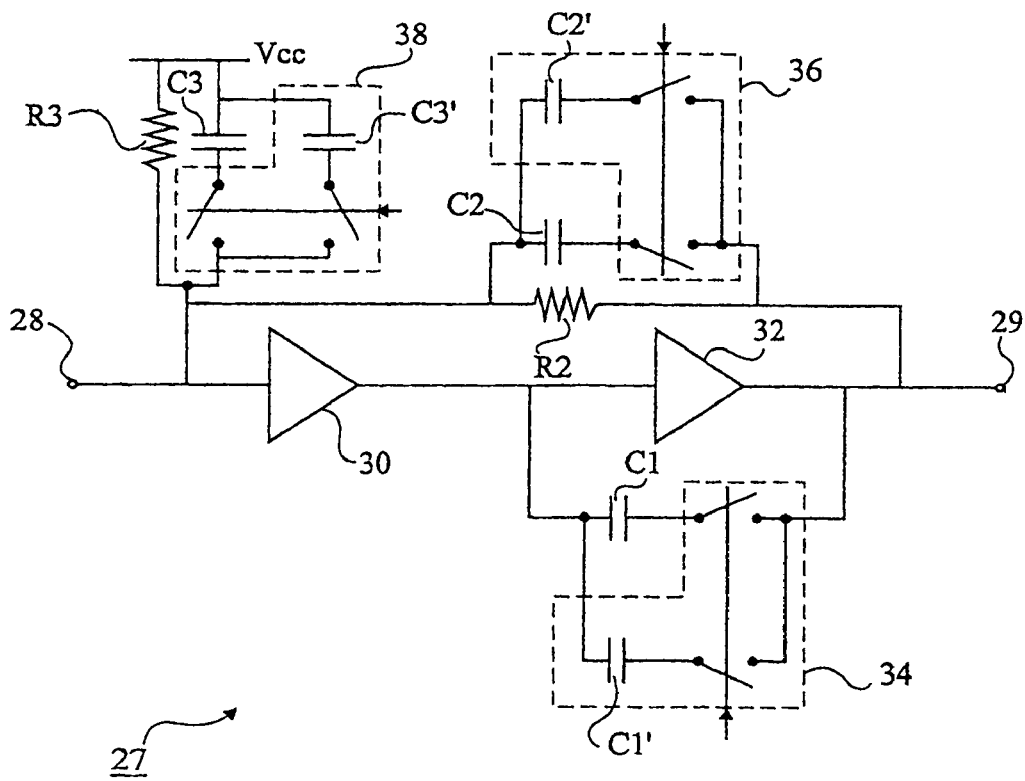
FIG. 4 schematically shows a second example of a filter provided with a setting element according to one embodiment of the present invention to increase its cut-off frequency.

FIG. 4 shows an example of a filter 27 having a current input 28 and a voltage output 29 usable in an amplification and filtering chain. Input terminal 28 of filter 27 is connected to the input terminal of a transresistance amplifier 30. The output terminal of amplifier 30 is connected to the input terminal of an integrator assembly formed of an amplifier 32 of infinite gain and of a capacitor C1 connected in parallel. The output terminal of amplifier 32 is connected to output terminal 29 of filter 27. A capacitor C2 and a resistor R2 are connected in parallel between the input and output terminals of filter 27. The input terminal of filter 27 is further connected to a supply voltage Vcc by a capacitor C3 and a resistor R3 connected in parallel. An embodiment of the present invention provides adding to filter 27 setting elements 34, 36, and 38 respectively enabling replacement of capacitors C1, C2, and C3 with capacitors of smaller value C1', C2', C3' in the setting phase.

In practice, if filter 27 is integrated on a chip, each capacitor C (C1, C2, C3) is formed of a capacitor of small value Cr connected in parallel to a plurality of small capacitors Cr', Cr", each series-connected to a respective programmable switch SWr', SWr".

Figure 5:
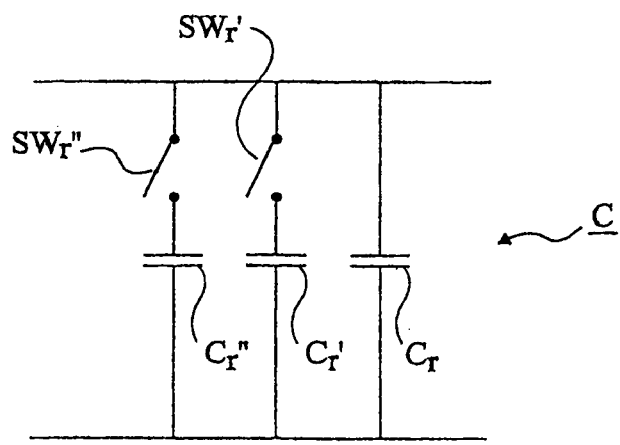
FIG. 5 illustrates the structure of a settable capacitor used according to an embodiment of the present invention.

FIG. 5 illustrates such a structure, which enables adjusting the values of capacitors C to compensate for possible drifts due to a fluctuation of the chip manufacturing process. For this purpose, after manufacturing of the chip, a calibration means is provided to program the turning-on of the appropriate number of switches SWr', SWr" for capacitors C to have the desired value. According to a particularly advantageous embodiment of the present invention, the elements for setting the correction circuit enable temporarily turning off switches SWr', SWr" in the correction circuit setting phase, to give capacitors C a minimum value. Two setting capacitors Cr', Cr" have been shown but, in practice, a larger number of setting capacitors will be used.

It should be noted by those skilled in the art that means according to embodiments of the present invention for increasing the cut-off frequency of an amplification and filtering chain by reducing the value of the capacitors of the low-pass filters of the chain are usable whatever the structure of the low-pass filters. This is an additional advantage of the embodiment(s).

Of course, the present invention is likely to have various alterations, modifications, and improvement which will readily occur to those skilled in the art. In particular, an embodiment has been described in relation with an amplification/filtering correction circuit comprising two amplifiers and two filters, but those skilled in the art will easily adapt embodiments to the correction circuit of any amplification/filtering chain comprising at least one low-pass filtering, the cut-off frequency of which depends on the value of at least one capacitor.

An embodiment has been described in relation with an amplification/filtering chain providing a zero output signal as a response to a zero input signal when the offset is corrected, but those skilled in the art will easily adapt the embodiments to an amplification/filtering chain providing a non-zero output signal as a response to a zero input signal when the offset is corrected.

An embodiment has been described in relation with a correction circuit enabling correcting the offset with a great accuracy within a given setting duration, but those skilled in the art will easily adapt embodiments to a correction circuit enabling correction of the offset with no accuracy improvement but within a reduced setting duration, or by making a compromise between the offset correction accuracy and the duration of the setting phase.

An embodiment has been described in relation with a correction circuit, the setting phase of which has not been detailed, but those skilled in the art will easily adapt embodiments to any appropriate correction circuit setting phase. For example, the setting phase may comprise, from a median value of the control word, of modifying bit after bit of the value of the control word, starting from the most significant bit, and to the least significant bit.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A circuit for correcting an offset of an amplification and low-pass filtering chain having a predetermined gain and a predetermined cut-off frequency depending on a value of at least one capacitor, the circuit comprising:
    a correction means for subtracting from an input signal of the chain a correction signal depending on a value of a programmable digital word;
    a digital automaton for, in a setting phase, searching, then memorizing one of two consecutive values of the digital word between which an output signal of the chain switches sign, the input signal being canceled during the setting phase; and
    a means for, during the setting phase, reducing the value of said at least one capacitor with respect to its normal operating value.

2. The circuit of claim 1 wherein the means for reducing the value of said at least one capacitor includes a means for, during the setting phase, reducing the value of each capacitor with respect to its normal operating value.

3. The circuit of claim 1 wherein the means for reducing the value of said at least one capacitor includes a means for switching said at least one capacitor with a capacitor of value smaller than the normal operating value of said at least one capacitor.

4. The circuit of claim 1 wherein said at least one capacitor is formed of a capacitor of small value connected in parallel to a plurality of small capacitors each series-connected to a respective programmable switch, and wherein the means for reducing the value of said at least one capacitor is capable of controlling the turning-off of the programmable switches.

5. A method for correcting an offset of a chain of amplification and low-pass filtering of an input signal, having a predetermined gain and a predetermined cut-off frequency depending on a value of at least one capacitor, the method comprising:
    a) canceling the input signal of the chain;
    b) subtracting from the input signal of the chain a correction signal depending on a value of a digital word and modifying said value from a predetermined initial value to any one of two consecutive values between which an output signal of the chain switches sign; and
    c) memorizing the value of the digital word;
    wherein, during implementation of b), the value of said at least one capacitor is reduced with respect to its normal operating value to increase the cut-off frequency.

6. The method of claim 5 wherein reducing the value of said at least one capacitor includes, during a setting phase, reducing the value of each capacitor with respect to its normal operating value.

7. The method of claim 5 wherein reducing the value of said at least one capacitor includes switching said at least one capacitor with a capacitor of value smaller than a normal operating value of said at least one capacitor.

8. The method of claim 5 wherein reducing the value of said at least one capacitor includes using programmable switches to control that value.

9. An apparatus to correct an offset of a filter chain having at least one cut-off frequency that depends on a value of at least one capacitor, the apparatus comprising:
    a setting element coupled to a filter in the filter chain to reduce, during a setting phase, the value of the at least one capacitor with respect to that capacitor's normal operating value;
    a converter coupled to an input terminal of the filter chain to subtract, from an input signal to the filter chain, a correction signal that depends on a value of a programmable digital word;
    an automaton to, in the setting phase, search and then memorize one of two consecutive values of the digital word between which an output signal of the filter chain switches sign; and
    a switch coupled to the input terminal of the filter chain to cancel the input signal during the setting phase.

10. The apparatus of claim 9 wherein the filter comprises:
    an input terminal and an output terminal;
    a resistor coupled between the input and output terminals of the filter; and
    the capacitor having a first terminal coupled to the output terminal and a second terminal coupled to ground,
    wherein the setting element includes:
    another capacitor of smaller value relative to the capacitor of the filter and having a first terminal coupled to the output terminal of the filter;
    a first switch coupled between a second terminal of the another capacitor and ground; and
    a second switch coupled between the second terminal of the capacitor of the filter and ground.

11. The apparatus of claim 10 wherein during normal operation, the first switch is off and the second switch is on, and wherein during the setting phase, the first switch is on and the second switch is off.

12. The apparatus of claim 9 wherein the filter includes:
    a current input terminal and a voltage output terminal;
    a first amplifier having an input terminal coupled to the current input terminal and having an output terminal;
    a second amplifier having an input terminal coupled to the output terminal of the first amplifier and having an output terminal coupled to the voltage output terminal, the second amplifier further being coupled to a first capacitor in parallel to form an integrator assembly, the first capacitor having a first terminal coupled to the output terminal of the first amplifier;
    a second capacitor and a first resistor coupled in parallel between the current input and voltage output terminals of the filter; and
    a third capacitor and a second resistor coupled in parallel and coupled between the current input terminal of the filter and a voltage reference.

13. The apparatus of claim 12 wherein the setting element is coupled to the first capacitor and to the voltage output terminal of the filter to reduce a value of the first capacitor during the setting phase.

14. The apparatus of claim 13, further comprising:
    a first additional setting element coupled to the second capacitor and to the voltage output terminal of the filter to reduce a value of the second capacitor during the setting phase; and
    a second additional setting element coupled to the third capacitor and to the current input terminal of the filter to reduce a value of the third capacitor during the setting phase.

15. The apparatus of claim 14 wherein each of the setting elements includes:
    an adjustment capacitor having a value that is smaller relative to a value of a capacitor to which the setting element is respectively coupled; and
    at least one switch coupled to the adjustment capacitor to control reduction of the value of the capacitor to which the setting element is respectively coupled.

16. The apparatus of claim 15 wherein the at least one switch comprises a plurality of programmable switches.

17. A circuit to correct an offset of an amplification and low-pass filter chain having a gain and a cut-off frequency depending on a value of at least one capacitor, the circuit comprising:
    a correction unit to subtract, from an input signal of the chain, a correction signal depending on a value of a programmable digital word;
    a digital automaton unit coupled to the correction unit to, in a setting phase, search and then memorize one of two consecutive values of the digital word between which an output signal of the chain switches sign;
    a switch coupled to the filter chain to cancel the input signal during the setting phase; and
    at least one setting element coupled to the at least one capacitor to, during the setting phase, reduce a value of the at least one capacitor with respect to its normal operating value to increase the cut-off frequency.

18. The circuit of claim 17 wherein the at least one capacitor is part of a filter, the filter comprising:
- an input terminal and an output terminal;
- a resistor coupled between the input and output terminals of the filter; and
- the at least one capacitor having a first terminal coupled to the output terminal and a second terminal coupled to ground, wherein the setting element includes:
- another capacitor of smaller value relative to the at least one capacitor of the filter and having a first terminal coupled to the output terminal of the filter;
- a first switch coupled between a second terminal of the another capacitor and ground; and
- a second switch coupled between the second terminal of the capacitor of the filter and ground.

19. The circuit of claim 18 wherein during normal operation, the first switch is off and the second switch is on, and wherein during the setting phase, the first switch is on and the second switch is off.

20. The circuit of claim 18 wherein the first switch is a programmable switch.

21. The circuit of claim 18 wherein the filter chain includes a transresistance amplifier and an integrator assembly, the circuit further comprising a plurality of setting elements respectively coupled to capacitors of the transresistance amplifier and the integrator assembly to reduce a value of these capacitors during the setting phase.

* * * * *